United States Patent
Aoki et al.

(10) Patent No.: US 9,258,007 B2
(45) Date of Patent: Feb. 9, 2016

(54) SCALE OF PHOTOELECTRIC ENCODER INCLUDING BASE MEMBER HAVING ROUGHENED SURFACE AND MANUFACTURING METHOD OF SCALE

(71) Applicant: MITUTOYO CORPORATION, Kawasaki-shi, Kanagawa (JP)

(72) Inventors: Toshihiko Aoki, Kawasaki (JP); Fujio Maeda, Kawasaki (JP); Michihiko Togashi, Kawasaki (JP)

(73) Assignee: MITUTOYO CORPORATION, Kawasaki-Shi (JP)

( * ) Notice: Subject to any disclaimer, the term of this patent is extended or adjusted under 35 U.S.C. 154(b) by 240 days.

(21) Appl. No.: 13/683,282

(22) Filed: Nov. 21, 2012

(65) Prior Publication Data
US 2013/0127644 A1   May 23, 2013

(30) Foreign Application Priority Data
Nov. 22, 2011   (JP) .................................. 2011-254868

(51) Int. Cl.
*H03M 1/22* (2006.01)
*G01D 5/347* (2006.01)

(52) U.S. Cl.
CPC ............. *H03M 1/22* (2013.01); *G01D 5/34707* (2013.01)

(58) Field of Classification Search
CPC .... B42D 19/00; B23Q 17/22; H01L 31/0232; H01L 21/0337; H01L 21/3046; H01L 21/30604; G01G 23/32; G01J 1/04; G01J 1/0407; G06G 1/065; B62D 15/02; G01D 5/12; G01D 5/243; G01D 5/264; G01D 5/28; G01D 5/347; G01D 5/34707; G01B 7/023; G01B 11/026; G03F 7/16; G02B 5/1847; G02B 5/1857
USPC ................... 250/237 G, 216, 231.13–231.18; 359/441, 442; 356/615, 616; 341/13, 341/14; 33/1 PT, 1 N, 1 M
See application file for complete search history.

(56) References Cited

U.S. PATENT DOCUMENTS

| | | | | |
|---|---|---|---|---|
| 4,343,890 | A | * | 8/1982 | Phillips et al. ................. 430/321 |
| 4,644,156 | A | * | 2/1987 | Takahashi et al. ............. 430/321 |
| 4,661,697 | A | * | 4/1987 | Takahashi et al. ............. 250/233 |
| 7,053,361 | B2 | * | 5/2006 | Mitamura et al. ........ 250/231.13 |

(Continued)

FOREIGN PATENT DOCUMENTS

| | | |
|---|---|---|
| EP | 2187177 A1 | 5/2010 |
| JP | 58-075004 | 5/1983 |

(Continued)

OTHER PUBLICATIONS

European Search Repon:, EP Application No. 12193695, dated Feb. 11, 2013 6 pages.

(Continued)

*Primary Examiner* — Que T Le
(74) *Attorney, Agent, or Firm* — Rankin, Hill & Clark LLP

(57) ABSTRACT

A scale of a photoelectric encoder includes a base member and gratings on the base member. The gratings can be formed on the surface of the base member by plating and arranged at a prescribed pitch on the base member. The surface of the base member is a roughened surface which is roughened by sandblasting or with a chemical. The gratings are light absorptive gratings or light reflective metal gratings.

20 Claims, 11 Drawing Sheets

(56) References Cited

U.S. PATENT DOCUMENTS

| | | | |
|---|---|---|---|
| 7,129,475 B2* | 10/2006 | Kanno et al. | 250/237 G |
| 7,332,711 B2* | 2/2008 | Kubo et al. | 250/237 G |
| 7,916,045 B2* | 3/2011 | Tominaga et al. | 341/13 |
| 7,916,305 B2* | 3/2011 | Maeda | 356/499 |
| 2006/0140538 A1* | 6/2006 | Isano et al. | 385/37 |
| 2010/0124610 A1* | 5/2010 | Aikawa et al. | 427/255.28 |
| 2010/0193671 A1* | 8/2010 | Oshida et al. | 250/231.1 |

FOREIGN PATENT DOCUMENTS

| | | |
|---|---|---|
| JP | 58-085112 A | 5/1983 |
| JP | 62-005126 A | 1/1987 |
| JP | 2003-241392 | 8/2003 |
| JP | 2005-91001 | 4/2005 |
| JP | 2006-162498 | 6/2006 |
| JP | 2006-337321 | 12/2006 |
| JP | 2007-121142 | 5/2007 |
| JP | 2008-170286 | 7/2008 |
| JP | 2009-264923 | 11/2009 |
| JP | 2009-276306 A | 11/2009 |
| JP | 2010-025908 | 2/2010 |
| JP | 20111-271174 | 12/2010 |
| WO | 2009/031608 | 3/2009 |

OTHER PUBLICATIONS

Japanese Office Action with English translation, issued Jul. 21, 2015, 15 pages.

* cited by examiner

SCALE OF PHOTOELECTRIC ENCODER INCLUDING BASE MEMBER HAVING ROUGHENED SURFACE AND MANUFACTURING METHOD OF SCALE

CROSS-REFERENCE TO RELATED APPLICATION(S)

The present application claims the benefit of priority of Japanese Patent Application No. 2011-254868, filed on Nov. 22, 2011. The disclosures of this application are incorporated herein by reference.

BACKGROUND

1. Technical Field

The present invention relates to a photoelectric encoder scale used in a linear encoder, a rotary encoder, or the like, and a manufacturing method of such a scale.

2. Related Art

For example, a photoelectric encoder has a main scale which extends along a measurement axis and an index scale which is disposed so as to be movable relative to the main scale. The photoelectric encoder is configured in such a manner that a light receiver receives, through the index scale, light that is reflected from the main scale after being emitted from a light source and incident on the main scale through the index scale. Each of the main scale and the index scale is formed with a grating (graduations) at a prescribed pitch. Various methods for forming a grating on each of the main scale and the index scale are known (Patent documents 1-8).

However, in these related-art techniques, the manufacturing cost is very high because a film forming apparatus for grating formation requires a vacuum chamber (Patent documents 1, 2, 5, and 6), it is difficult to form a grating with high accuracy (Patent documents 3, 4, 6, and 8), or the detection accuracy is lowered due to reduction of the reflection light quantity (Patent document 7).

PATENT DOCUMENTS

[Patent document 1] JP-A-2006-162498
[Patent document 2] JP-A-2009-264923
[Patent document 3] JP-A-2006-337321
[Patent document 4] JP-A-2010-025908
[Patent document 5] JP-B-63-011605
[Patent document 6] JP-A-2008-170286
[Patent document 7] JP-A-2010-271174
[Patent document 8] JP-A-2003-241392

SUMMARY

One or more exemplary embodiments of the present invention provide a photoelectric encoder scale which is low in manufacturing cost, exhibits good characteristics, is high in the adhesion and the thickness distribution uniformity of a film formed, and is high in grating shape accuracy, as well as a manufacturing method of such a scale.

A scale of a photoelectric encoder according to an exemplary embodiment comprises:
a base member; and
gratings which are formed on a surface of the base member by plating and arranged at a prescribed pitch on the base member.
In the scale of a photoelectric encoder,
the base member may be a base member which is conductive and has a light reflection surface; and
the gratings may be light absorptive gratings.
In the scale of a photoelectric encoder,
the base member may be a base member having a roughened surface; and
the gratings may be light reflective metal gratings.
The scale of a photoelectric encoder may further comprise:
a conductive light transmission film formed on the surface of the base member, wherein:
the base member may be a light absorptive or transmissive base member; and
the gratings may be light reflective metal gratings which are formed by electroplating.
The scale of a photoelectric encoder may further comprise:
a conductive metal light reflection film formed on the surface of the base member, wherein:
the gratings may be metal gratings which are formed on a surface of the metal light reflection film by plating and arranged at a prescribed pitch on the metal light reflection film; and
the metal gratings may be made of a light reflection film which is made of the same metal as the metal light reflection film.

A method of manufacturing a scale of a photoelectric encoder, according to an exemplary embodiment of the invention, comprises:
performing underlying surface treatment on a surface of a base member; and
forming metal gratings on a surface of the base member that has been subjected to the underlying surface treatment by plating so that the metal gratings are arranged at a prescribed pitch.

The forming the metal gratings may include
forming a metal film by plating on the surface of the base member that has been subjected to the underlying surface treatment;
forming resists on the metal film at a prescribed pitch; and
forming the metal gratings on the base member at the prescribed pitch by etching the metal film using the resists as a mask.

The forming the metal gratings may include
forming resists at a prescribed pitch on the surface of the base member that has been subjected to the underlying surface treatment;
forming a metal film on portions, located between the resists, of the surface of the base member by plating; and
forming the metal gratings on the base member at the prescribed pitch by removing the resists.

According to the invention, it is possible to provide a photoelectric encoder scale which is low in manufacturing cost, exhibits good characteristics, and is high in the adhesion and the thickness distribution uniformity of a film formed, and is high in grating shape accuracy, as well as a manufacturing method of such a scale.

DETAILED DESCRIPTION

Embodiments of the present invention will be hereinafter described in detail with reference to the drawings.

Embodiment 1

Figure 1:
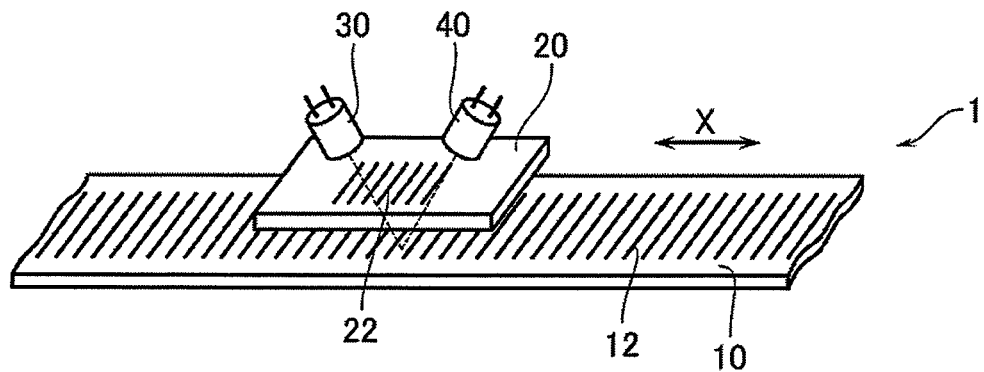
FIG. 1 is a perspective view showing an outline of a photoelectric encoder 1 according to a first embodiment.

FIG. 1 is a perspective view which outlines the configuration of a photoelectric encoder 1 according to a first embodiment of the invention. The photoelectric encoder 1 has a main scale 10, an index scale 20, a light source 30, and a light receiver 40. The main scale 10 extends along a measurement axis X. The index scale 20 is moved relative to the main scale 10. The light source 30 applies light to the main scale 10 through the index scale 20. The light receiver 40 receives, through the index scale 20, light that is reflected from the main scale 10. The main scale 10 and the index scale 20 are formed with respective gratings 12 and 22 (graduations) at a prescribed pitch. As the main scale 10 and the index scale 20 are moved relative to each other, the phase relationship between the gratings 12 and 22 of the scales 10 and 20 varies. This variation is detected optically by the light receiver 40, whereby the position of the index scale 20 with respect to the main scale 10 is detected.

Figure 2A:
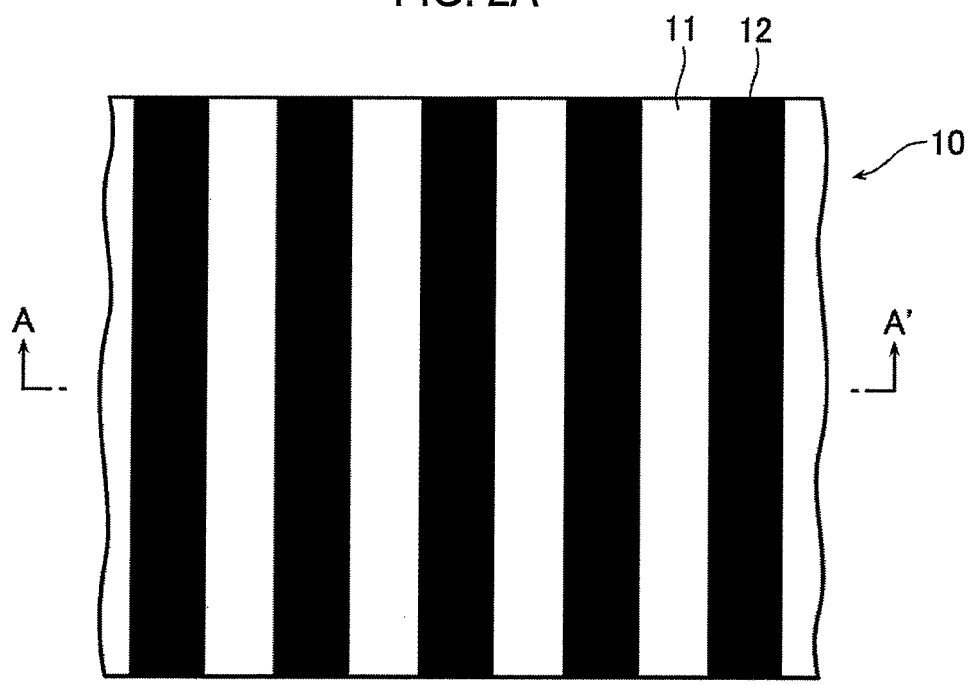
FIG. 2A is a plan view showing part of a main scale 10 used in the photoelectric encoder 1 according to the first embodiment.
Figure 2B:
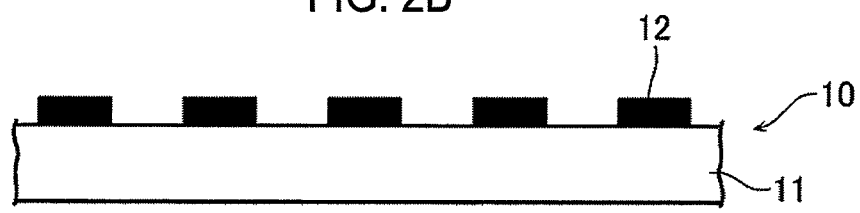
FIG. 2B is a sectional view showing part of the main scale 10 used in the photoelectric encoder 1 according to the first embodiment.

Next, the main scale 10 will be described in a specific manner with reference to FIGS. 2A and 2B. FIG. 2A is a plan view showing part of the main scale 10 in an enlarged manner, and FIG. 2B is a sectional view taken along line A-A' in FIG. 2A.

The main scale 10 is used as a reflection-type amplitude grating. As shown in FIG. 2B, the main scale 10 has a base member 11 and plural black gratings 12. The base member 11 is made of a metal (e.g., stainless steel, iron, or aluminum) which is conductive and has a light reflection surface. The black gratings 12 are formed on one surface of the base member 11 so as to be arranged at a prescribed pitch in the longitudinal direction of the base member 11. The black gratings 12 serve to form, on the base member 11, light/dark portions which are arranged in the longitudinal direction and function as graduations. The black gratings 12 are formed with a light absorptive material by, for example, black plating (of black nickel or black chromium) or blackening, and light reflectance of the black gratings 12 are lower than that of the base member 11.

Since as described above the black gratings 12 are formed on the base member 11 which is made of a conductive metal, they can be formed by not only electroless plating but also electroplating.

Figure 3A:
FIGS. 3A-3D are sectional views showing a first manufacturing method of the main scale 10 according to the first embodiment.

Next, a first manufacturing method of the main scale 10 according to the first embodiment will be described with reference to FIGS. 3A-3D. First, as shown in FIG. 3A, a black thin film 12' whose thickness is 10 μm or less is formed on a base member 11 by electroplating of black nickel, black chromium, or the like.

Figure 3B:
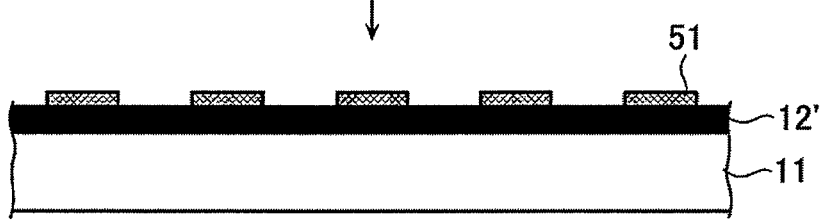
Figure 3C:
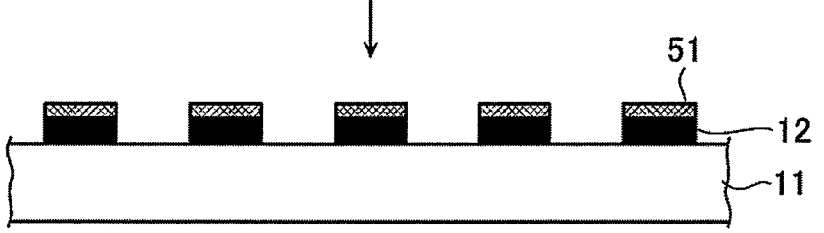
Figure 3D:
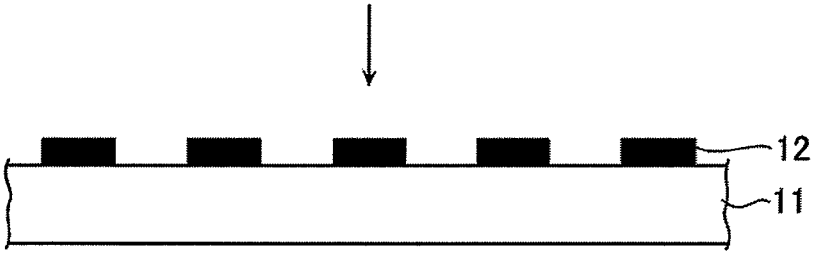

Then, as shown in FIG. 3B, resists 51 are formed on the black thin film 12' so as to be arranged at a prescribed pitch in the longitudinal direction of the base member 11. Then, as shown in FIG. 3C, the black thin film 12' is etched through the resists 51. In this etching, a nitric-acid-based etching liquid is used in the case where the black thin film 12' is made of black nickel and cerium(IV) ammonium nitrate is used in the case where the black thin film 12' is made of black chromium. Those portions of the black thin film 12' which remain after the etching are plural black gratings 12 which are arranged at the prescribed pitch in the longitudinal direction of the base member 11. Then, the resists 51 are removed as shown in FIG. 3D.

Figure 4A:
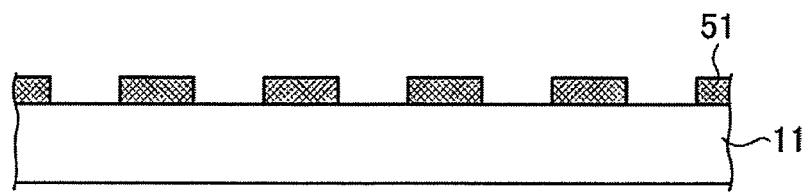
FIGS. 4A-4C are sectional views showing a second manufacturing method of the main scale 10 according to the first embodiment.
Figure 4B:
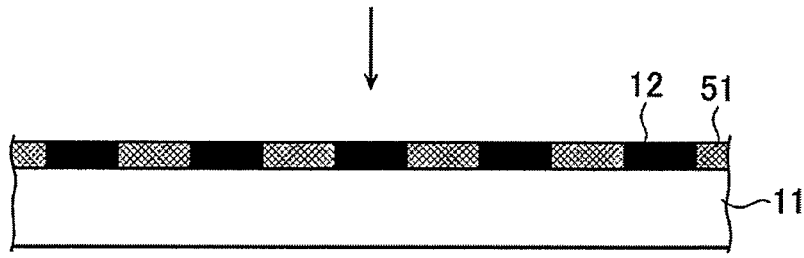
Figure 4C:
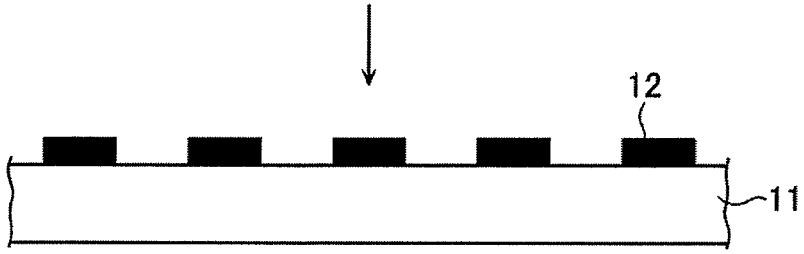

Next, a second manufacturing method of the main scale 10 according to the first embodiment will be described with reference to FIGS. 4A-4C. First, as shown in FIG. 4A, resists 51 are formed on a base member 11 so as to be arranged at a prescribed pitch in the longitudinal direction of the base member 11. Then, as shown in FIG. 4B, plural black gratings 12 are formed by black plating (described above), for example, so as to fill in the spaces between the resists 51. Then, the resists 51 are removed as shown in FIG. 4C.

According to the first embodiment, the manufacturing cost can be made low because the black gratings 12 are formed on the metal base member 11 by plating and hence it is not necessary to use a vacuum chamber. The reflection efficiency is high because the adhesion and the thickness distribution uniformity of a film formed are high and no interfering light transmission film or the like is used. Another advantage is that the grating shape accuracy is high because the black gratings 12 are formed by photolithography.

In particular, the first manufacturing method provides an advantage that the resists 51 can be formed by a simple process because no limitations relating to plating, the resistance to pretreatment chemicals, or other factors are imposed on their material.

The second manufacturing method enables further cost reduction because etching of a black thin film 12' is not necessary. Another advantage is that the second manufacturing method is free of grating shape deterioration due to side etching.

Embodiment 2

Next, a photoelectric encoder according to a second embodiment will be described with reference to FIG. 5. The second embodiment is different from the first embodiment in a main scale 10a (see FIG. 5). The items used in the second embodiment other than the main scale 10a are the same as used in the first embodiment, and hence will not be described in detail below.

Figure 5:
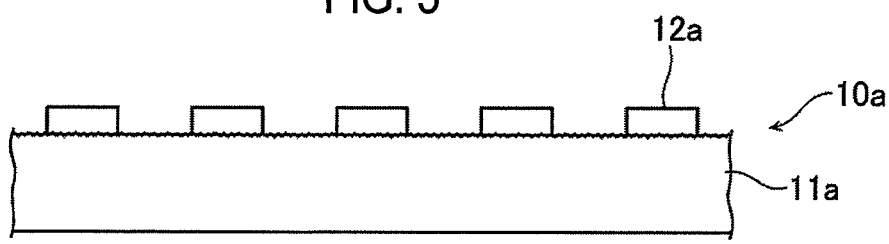
FIG. 5 is a sectional view showing a main scale 10a according to a second embodiment.

A base member 11a of the main scale 10a is made of a metal, glass, ceramic, a carbon composite, or the like, and its top surface is roughened as shown in FIG. 5. The bottom surface of the base member 11a may also be roughened. As a further alternative, all the surfaces of the base member 11a may be roughened. Metal gratings 12a are formed as a light reflection film on the roughened top surface of the base member 11a. Since the underlying surface is roughened, the metal gratings 12a are formed by plating capable of leveling using a plating material that is, for example, nickel or chromium added with a brightener. The metal gratings 12a are arranged at a prescribed pitch in the longitudinal direction of the base member 11a.

Figure 6A:
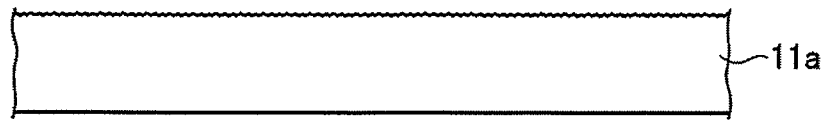
FIGS. 6A-6E are sectional views showing a first manufacturing method of the main scale 10a according to the second embodiment.
Figure 6B:
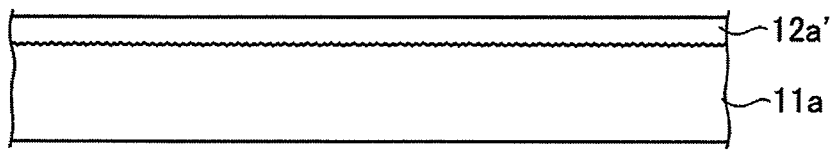
Figure 6C:
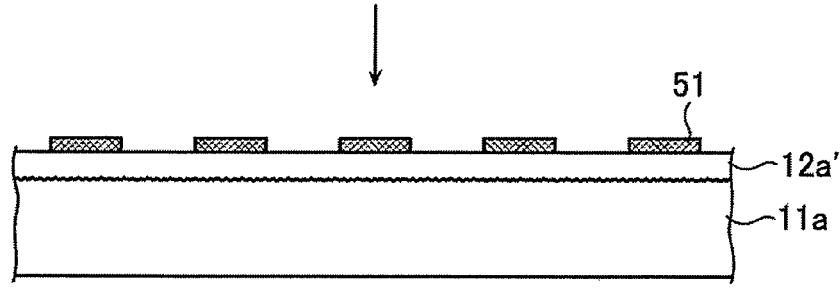
Figure 6D:
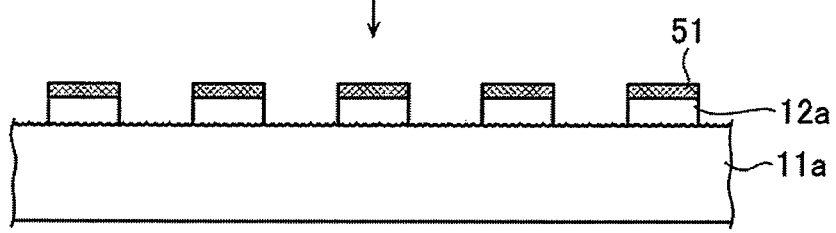
Figure 6E:
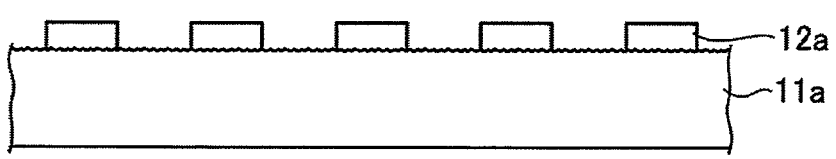

Next, a first manufacturing method of the main scale 10a according to the second embodiment will be described with reference to FIGS. 6A-6E. First, as shown in FIG. 6A, the top surface of a base member 11a is roughened (underlying surface treatment). The roughening may be performed by sandblasting or with a chemical. Then, as shown in FIG. 6B, a metal thin film 12a' is formed on the roughened surface of the base member 11a by electroplating or electroless plating at a thickness that is large enough to flatten the roughened surface. Subsequently, as in the steps of FIGS. 3B-3D, resists 51 are formed (see FIG. 6C), the metal thin film 12a' is etched (see FIG. 6D), and the resists 51 are removed (see FIG. 6E). A main scale 10a is thus completed.

Figure 7A:
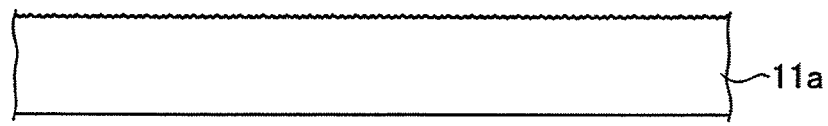
FIGS. 7A-7D are sectional views showing a second manufacturing method of the main scale 10a according to the second embodiment.
Figure 7B:
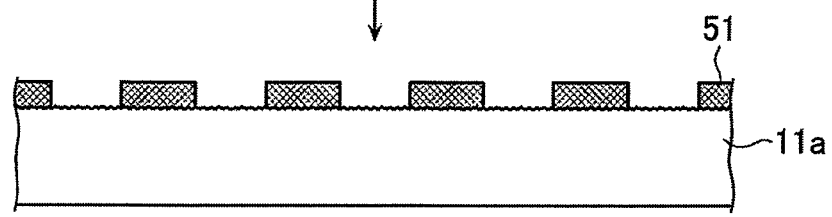
Figure 7C:
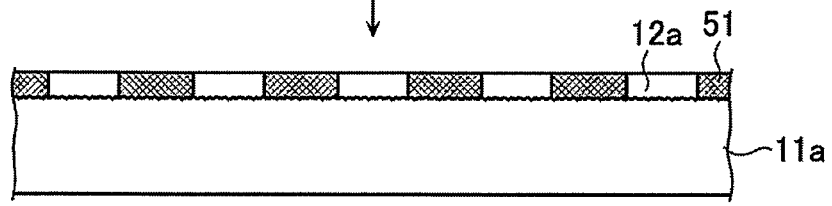
Figure 7D:
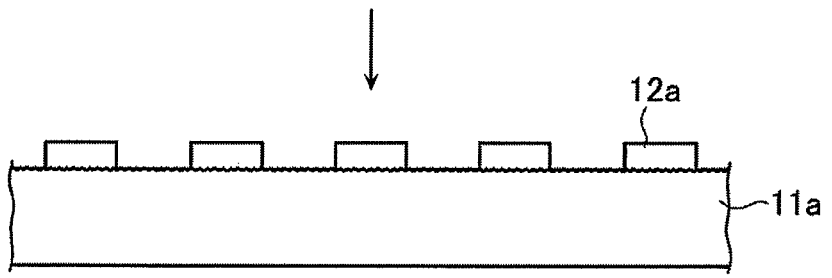

Next, a second manufacturing method of the main scale 10a according to the second embodiment will be described with reference to FIGS. 7A-7D. First, as shown in FIG. 7A, the top surface of a base member 11a is roughened. Then, as shown in FIG. 7B, resists 51 are formed on the roughened surface of the base member 11a so as to be arranged at a prescribed pitch in the longitudinal direction of the base member 11a. Then, as shown in FIG. 7C, plural metal gratings 12a are formed by electroplating or electroless plating so as to fill in the spaces between the resists 51 at a thickness that is large enough to flatten the roughened surface. Then, the resists 51 are removed as shown in FIG. 7D.

According to the second embodiment, the adhesion of the metal gratings 12a to the base member 11a is increased because of the anchor effect because the metal gratings 12a are formed by plating on the roughened surface of the base member 11a. Where the metal gratings 12a as a light reflection film are formed on a metal base member 11a, the metal gratings 12a can be formed by electroplating.

Where the base member 11a is made of a low-reflectance material such as glass, this embodiment provides an advantage that the influence of stray light produced by diffused reflection is small.

Embodiment 3

Figure 8:
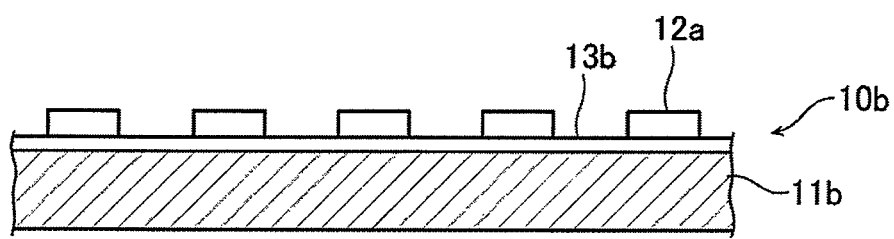
FIG. 8 is a sectional view showing a main scale 10b according to a third embodiment.

Next, a photoelectric encoder according to a third embodiment will be described with reference to FIG. 8. The third embodiment is different from the first embodiment in a main scale 10b (see FIG. 8). The items used in the third embodiment other than the main scale 10b are the same as used in the first embodiment, and hence will not be described in detail below. In the main scale 10b, items having the same ones in the above embodiments will be given the same reference symbols as the latter and will not be described in detail.

Whereas the main scales 10 and 10a according to the first and second embodiments are reflection-type amplitude gratings, the main scale 10b according to the third embodiment is used as a reflection-type phase grating. In the main scale 10b, as shown in FIG. 8, a conductive film 13b is formed on the surface of a base member 11b by underlying surface treatment. The metal gratings 12a are formed on the top surface of the base member 11b through the conductive film 13b. The base member 11b is made of glass. The conductive film 13b is light reflective and is made of the same metal (e.g., nickel) as the metal gratings 12a. Likewise, the metal gratings 12a is formed as a reflection film. In the third embodiment, to form a phase grating, the thickness of the metal gratings 12a is set equal to ¼ of the wavelength of light to be applied to the main scale 10b.

Since as described above the metal gratings 12a are formed by plating on the conductive film 13b which is made of the same metal as the metal gratings 12a, the metal gratings 12a can be formed by electroplating or electroless plating with high adhesion to the conductive film 13b.

Figure 9A:
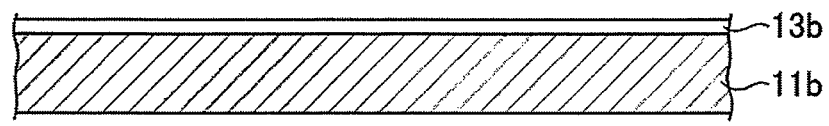
FIGS. 9A-9D are sectional views showing a manufacturing method of the main scale 10b according to the third embodiment.
Figure 9B:
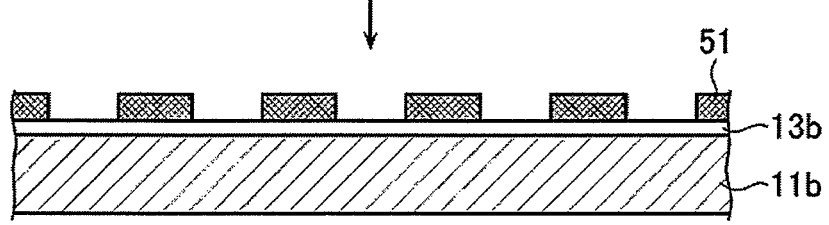
Figure 9C:
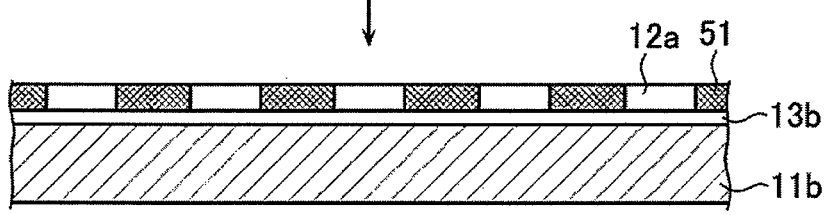
Figure 9D:
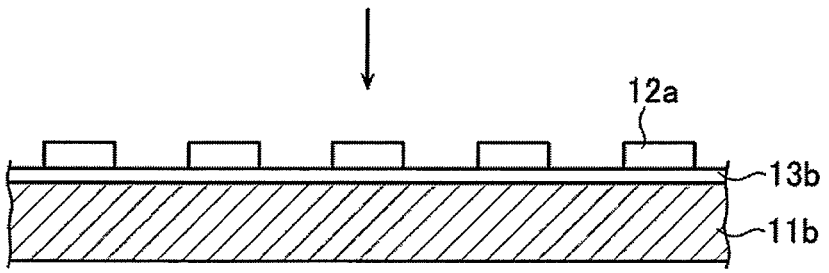

Next, a manufacturing method of the main scale 10b according to the third embodiment will be described with reference to FIGS. 9A-9D. First, as shown in FIG. 9A, a conductive film 13b is formed on the top surface of a base member 11b by electroless plating (underlying surface treatment). Then, as shown in FIG. 9B, resists 51 are formed on the conductive film 13b so as to be arranged at a prescribed pitch in the longitudinal direction of the base member 11b. Then, as shown in FIG. 9C, plural metal gratings 12a are formed with the same metal material as the material of the conductive film 13b by electroplating or electroless plating so as to fill in the spaces between the resists 51. Then, the resists 51 are removed as shown in FIG. 9D.

In the third embodiment, the metal gratings 12a require severe film thickness management because the main scale 10b constitutes a phase grating. However, the third embodiment provides advantages that the metal gratings 12a can be formed with high accuracy by either of electroplating and electroless plating, no reduction occurs in the reflection light quantity, and the thickness distribution uniformity and the adhesion of a film formed are high.

Embodiment 4

Next, a photoelectric encoder according to a fourth embodiment will be described with reference to FIG. 10. The fourth embodiment is different from the first embodiment in a main scale 10c (see FIG. 10). The items used in the fourth embodiment other than the main scale 10c are the same as used in the first embodiment, and hence will not be described in detail below. In the main scale 10c, items having the same ones in the above embodiments will be given the same reference symbols as the latter and will not be described in detail.

Figure 10:
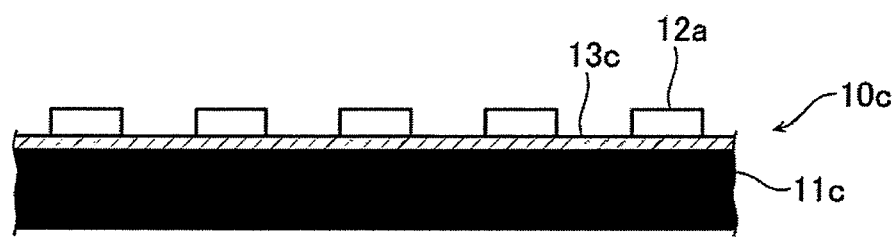
FIG. 10 is a sectional view showing a main scale 10c according to a fourth embodiment.

In the main scale 10c, as shown in FIG. 10, a transparent conductive film 13c is formed on the surface of a base member 11c by underlying surface treatment. The base member 11c is made of a light absorptive material (e.g., a black-plated metal, glass, ceramic, or a carbon composite) or a light transmissive material (e.g., glass). For example, the transparent conductive film 13c is made of indium tin oxide (ITO), tin oxide ($SnO_2$), or zinc oxide (ZnO). The metal gratings 12a as a light reflection film are formed on the transparent conductive film 13c. Since the base member 11c is made of a light absorptive or transmissive material, light that is not incident on the metal gratings 12a passes through the transparent conductive film 13c and is absorbed by the base member 11c or passes through the base member 11c. Therefore, the light receiver 40 detects only light that is reflected from the metal gratings 12a.

Figure 11A:
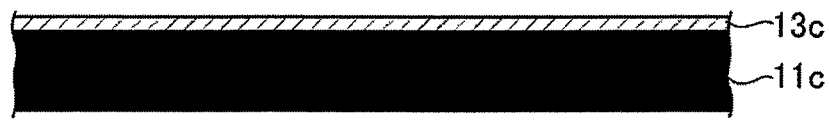
FIGS. 11A-11E are sectional views showing a first manufacturing method of the main scale 10c according to the fourth embodiment.
Figure 11B:
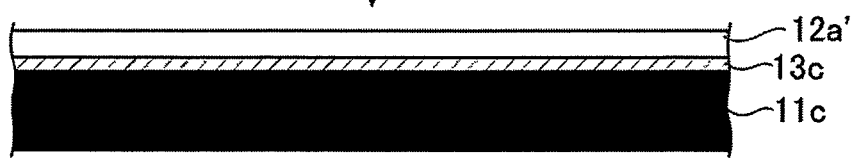
Figure 11C:
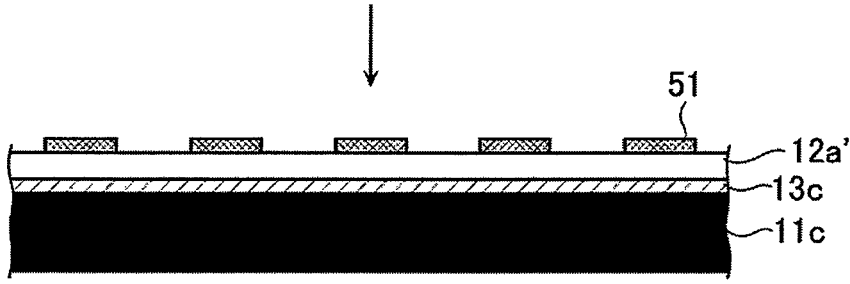
Figure 11D:
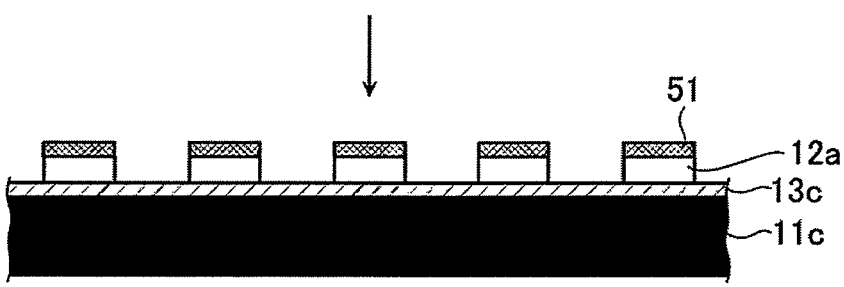
Figure 11E:
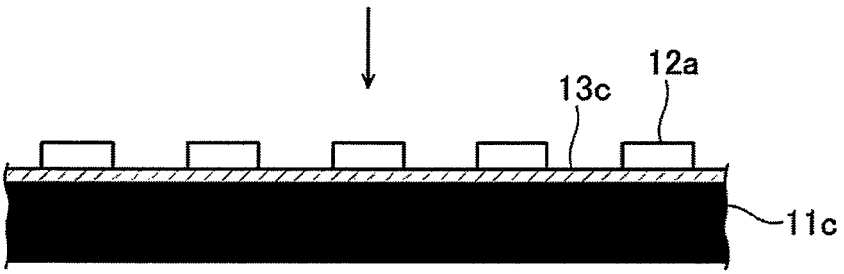

Next, a first manufacturing method of the main scale 10c according to the fourth embodiment will be described with reference to FIGS. 11A-11E. First, as shown in FIG. 11A, a transparent conductive film 13c is formed on the top surface of a base member 11c by, for example, application which is a low cost method (underlying surface treatment). Then, as shown in FIG. 11B, a metal thin film 12a' is formed on the base member 11a by electroplating using the transparent conductive film 13c as a seed layer. Subsequently, as in the steps of FIGS. 3B-3D, resists 51 are formed (see FIG. 11C), the metal thin film 12a' is etched (see FIG. 11D), and the resists 51 are removed (see FIG. 11E). A main scale 10c is thus completed.

Figure 12A:
FIGS. 12A-12D are sectional views showing a second manufacturing method of the main scale 10c according to the fourth embodiment.
Figure 12B:
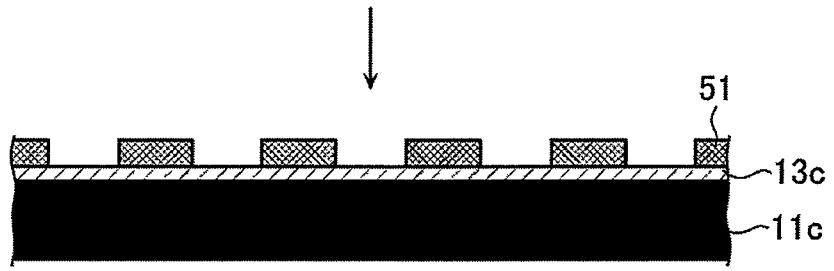
Figure 12C:
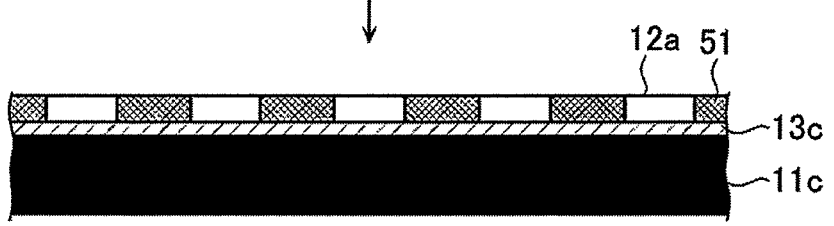
Figure 12D:
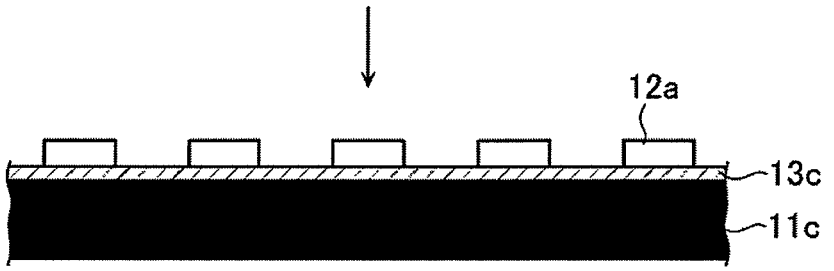

Next, a second manufacturing method of the main scale 10c according to the fourth embodiment will be described with reference to FIGS. 12A-12D. First, as shown in FIG. 12A, a transparent conductive film 13c is formed on the top surface of a base member 11c by application (underlying surface treatment). Then, as shown in FIG. 12B, resists 51 are formed on the transparent conductive film 13c so as to be arranged at a prescribed pitch in the longitudinal direction of the base member 11c. Then, as shown in FIG. 12C, plural metal gratings 12a are formed by electroplating so as to fill in the spaces between the resists 51. Then, the resists 51 are removed as shown in FIG. 12D.

The fourth embodiment provides the same advantages as the first to third embodiments. Furthermore, according to this embodiment, electroplating can be performed easily because the transparent conductive film 13c serves as a plating seed layer, with an additional advantage that the seed layer need not be removed. Still further, where the main scale 10c is of a reflection type, the influence from the base member 11c can be made smaller by setting the thickness of the transparent conductive film 13c equal to λ/4.

Furthermore, this embodiment is advantageous in that the main scale 10c can be used as either of a reflection-type amplitude grating and a transmission-type amplitude grating in the case where the base member 11c is made of a transparent material.

Embodiment 5

Next, a photoelectric encoder according to a fifth embodiment will be described with reference to FIG. 13. The fifth embodiment is different from the first embodiment in a main scale 10d (see FIG. 13). The items used in the fifth embodiment other than the main scale 10d are the same as used in the first embodiment, and hence will not be described in detail below. In the main scale 10d, items having the same ones in the above embodiments will be given the same reference symbols as the latter and will not be described in detail.

Figure 13:
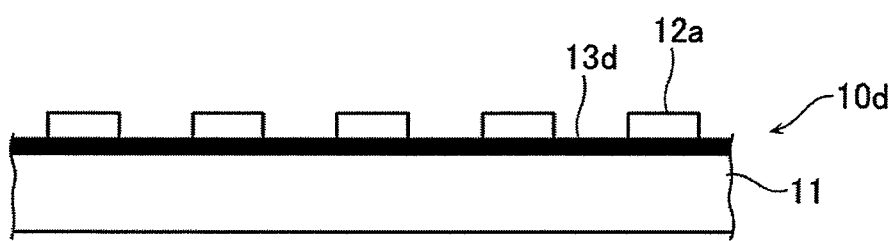
FIG. 13 is a sectional view showing a main scale 10d according to a fifth embodiment.

In the main scale 10d, as shown in FIG. 13, a blackened layer 13d is formed by blackening the surface of the base member 11 (underlying layer treatment). The metal gratings 12a are formed as a light reflection film on the blackened layer 13d. The blackening treatment for forming the blackened layer 13d may be surface oxidation or the like.

Figure 14A:
FIGS. 14A-14D are sectional views showing a manufacturing method of the main scale 10d according to the fifth embodiment.
Figure 14B:
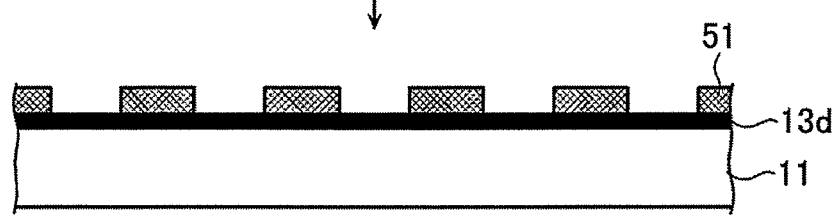
Figure 14C:
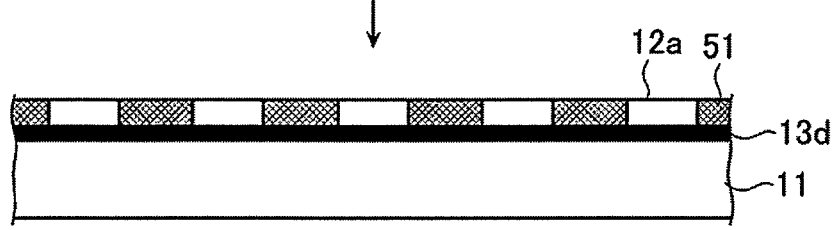
Figure 14D:
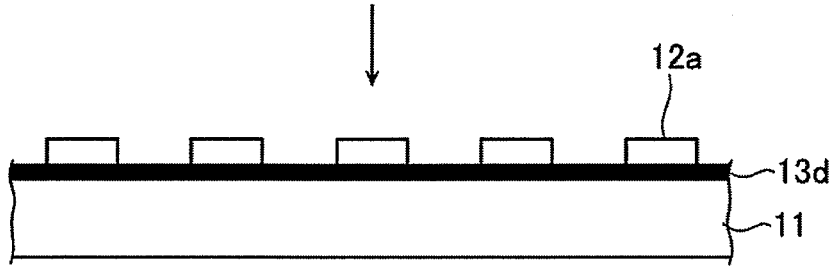

Next, a manufacturing method of the main scale 10d according to the fifth embodiment will be described with reference to FIGS. 14A-14D. First, as shown in FIG. 14A, a blackened layer 13d is formed by blackening the surface of a metal base member 11 made of stainless steel, iron, aluminum, or the like (underlying layer treatment; oxidation or black nickel formation). Then, as shown in FIG. 14B, resists 51 are formed on the blackened layer 13d so as to be arranged at a prescribed pitch in the longitudinal direction of the base member 11. Then, as shown in FIG. 14C, plural metal gratings 12a are formed by electroplating or electroless plating so as to fill in the spaces between the resists 51. Then, the resists 51 are removed as shown in FIG. 14D.

The fifth embodiment provides, in addition to the above-described advantages, an advantage that the adhesion of a metal thin film to the base member 11 is made higher by the blackening treatment.

Embodiment 6

Next, a photoelectric encoder according to a sixth embodiment will be described with reference to FIG. 15. The sixth embodiment is different from the first embodiment in a main scale 10e (see FIG. 15). The items used in the sixth embodiment other than the main scale 10e are the same as used in the first embodiment, and hence will not be described in detail below. In the main scale 10e, items having the same ones in the above embodiments will be given the same reference symbols as the latter and will not be described in detail.

Figure 15:
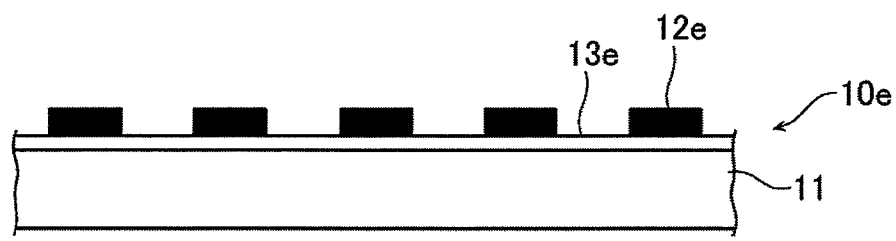
FIG. 15 is a sectional view showing a main scale 10e according to a sixth embodiment.

In the main scale 10e, as shown in FIG. 15, a conductive film 13e is formed as a light reflection film on the surface of the base member 11 by nickel plating, chromium plating, or the like (underlying surface treatment). Metal gratings 12e are made of a black plating material (black nickel or black chromium) which is light absorptive. The base member 11 may be made of any material such as a metal, glass, or a resin. Where the base member 11 is made of a non-conductive material, the conductive film 13e can be formed by electroless plating.

Figure 16A:
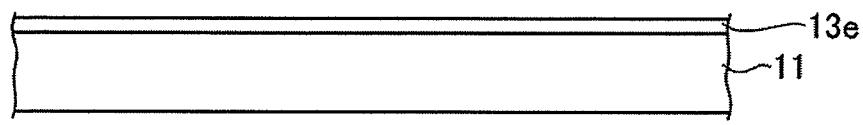
FIGS. 16A-16E are sectional views showing a first manufacturing method of the main scale 10e according to the sixth embodiment.
Figure 16A:
Figure 16B:
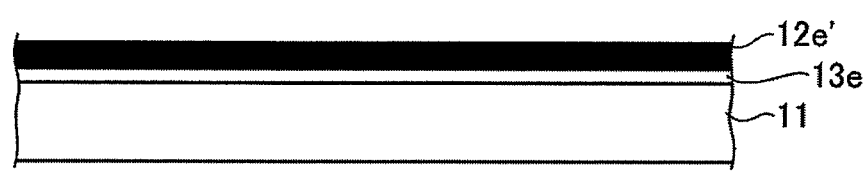
Figure 16B:
Figure 16C:
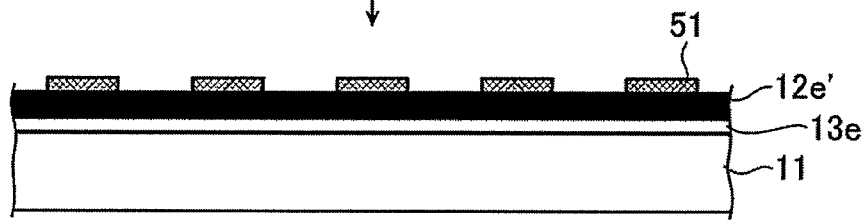
Figure 16C:
Figure 16D:
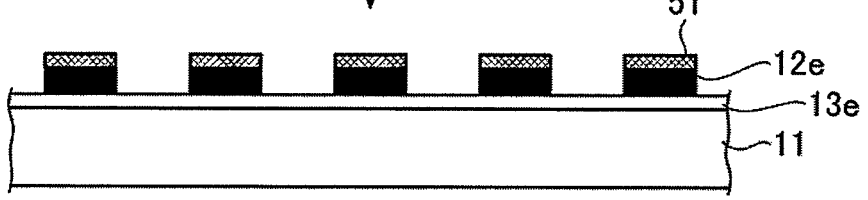
Figure 16D:
Figure 16E:
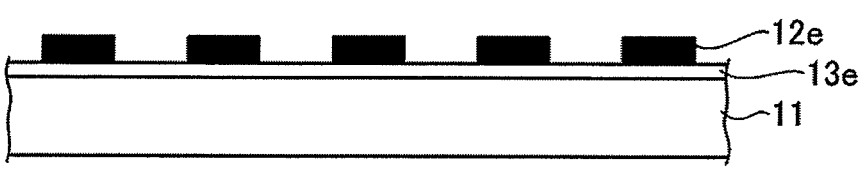

Next, a first manufacturing method of the main scale 10e according to the sixth embodiment will be described with reference to FIGS. 16A-16E. First, as shown in FIG. 16A, a conductive film 13e as a light reflection film is formed on the top surface of a base member 11 by plating, for example (underlying surface treatment). Then, as shown in FIG. 16B, a metal thin film 12e' as a light absorption film is formed on the surface of the conductive film 13e by black plating, for example. Subsequently, as in the steps of FIGS. 3B-3D, resists 51 are formed (see FIG. 16C), the metal thin film 12e' is etched (see FIG. 16D), and the resists 51 are removed (see FIG. 16E). A main scale 10e is thus completed.

Figure 17A:
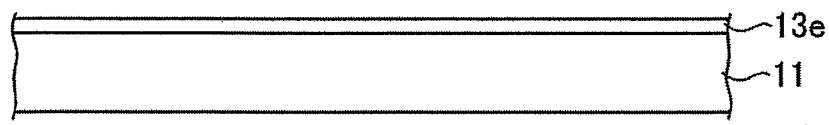
FIGS. 17A-17D are sectional views showing a second manufacturing method of the main scale 10e according to the sixth embodiment.
Figure 17B:
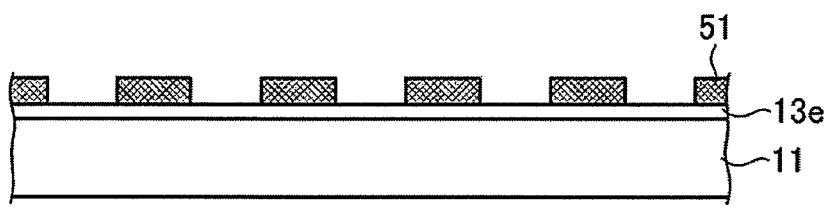
Figure 17C:
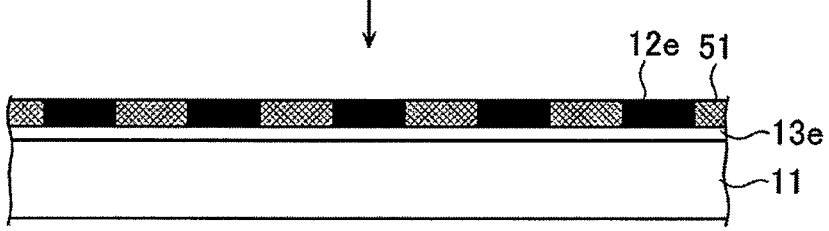
Figure 17D:
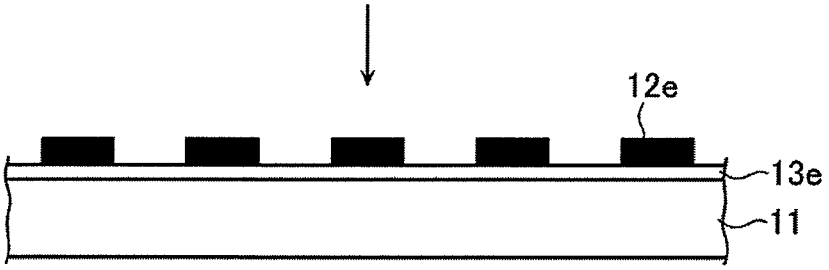

Next, a second manufacturing method of the main scale 10e according to the sixth embodiment will be described with reference to FIGS. 17A-17D. First, as shown in FIG. 17A, a conductive film 13e as a light reflection film is formed on the top surface of a base member 11c by plating, for example. Then, as shown in FIG. 17B, resists 51 are formed on the surface of the conductive film 13e so as to be arranged at a prescribed pitch in the longitudinal direction of the base member 11. Then, as shown in FIG. 17C, plural metal gratings 12e are formed by black plating so as to fill in the spaces between the resists 51. Then, the resists 51 are removed as shown in FIG. 17D.

The sixth embodiment provides, in addition to the above-described advantages, advantages that a film thickness control can be performed easily because the metal gratings 12e are a light absorption layer which is formed by black plating and that an optimum material can be selected for the base member 11 because no limitations are imposed on the material of the base member 11.

Although the above embodiments of the invention are directed to the linear encoders, it goes without saying that the invention can also be applied to a rotary encoder.

What is claimed is:

1. A scale of a photoelectric encoder comprising:
a base member having a surface, a whole area of which is roughened; and
gratings which are formed on the roughened surface of the base member by plating and arranged at a prescribed pitch on the base member,
wherein
the gratings are light absorptive gratings or light reflective metal gratings, and
the whole area of the surface of the base member is roughened to increase adhesion of the gratings to the base member.

2. The scale of a photoelectric encoder according to claim 1, wherein:
the base member is a base member which is conductive and has a light reflection surface; and
the gratings are light absorptive gratings.

3. The scale of a photoelectric encoder according to claim 1, wherein:
the gratings are light reflective metal gratings.

4. The scale of a photoelectric encoder according to claim 1, further comprising:
a conductive light transmission film formed on the surface of the base member, wherein:
the base member is a light absorptive or transmissive base member; and
the gratings are light reflective metal gratings which are formed on a surface of the conductive light transmission film by electroplating.

5. The scale of a photoelectric encoder according to claim 1, further comprising:
a conductive metal light reflection film formed on the surface of the base member, wherein:
the gratings are metal gratings which are formed on a surface of the metal light reflection film by plating and arranged at a prescribed pitch on the metal light reflection film; and
the metal gratings are made of a light reflection film which is made of the same metal as the metal light reflection film.

6. A method of manufacturing a scale of a photoelectric encoder, comprising:
roughening a whole area of a surface of a base member to increase adhesion of metal gratings to the base member; and
forming metal gratings on the surface of the base member that has been subjected to the roughening by plating so that the metal gratings are arranged at a prescribed pitch.

7. The method of manufacturing a scale of a photoelectric encoder according to claim 6, wherein:
the forming the metal gratings includes
forming a metal film by plating on the surface of the base member that has been subjected to the roughening;
forming resists on the metal film at a prescribed pitch; and
forming the metal gratings on the base member at the prescribed pitch by etching the metal film using the resists as a mask.

8. The method of manufacturing a scale of a photoelectric encoder according to claim 7, wherein:
the metal gratings are made of a light reflection film.

9. The method of manufacturing a scale of a photoelectric encoder according to claim 7, wherein:
the base member is made of a light absorptive or transmissive material;
the method further comprises:
forming a transparent conductive film on the surface of the base member; and
the metal gratings are made of a light reflection film.

10. The method of manufacturing a scale of a photoelectric encoder according to claim 7, further comprising:
forming a conductive light reflection film on the surface of the base member,
wherein the metal gratings are made of a blackened metal film.

11. The method of manufacturing a scale of a photoelectric encoder according to claim 6, wherein:
the forming the metal gratings includes
forming resists at a prescribed pitch on the surface of the base member that has been subjected to the roughening;
forming a metal film on portions, located between the resists, of the surface of the base member by plating; and
forming the metal gratings on the base member at the prescribed pitch by removing the resists.

12. The method of manufacturing a scale of a photoelectric encoder according to claim 11, wherein:
the metal gratings are made of a light reflection film.

13. The method of manufacturing a scale of a photoelectric encoder according to claim 11, further comprising:
forming a conductive metal light reflection film on the surface of the base member,
wherein the metal gratings are made of a light reflection film which is made of the same metal as the metal light reflection film.

14. The method of manufacturing a scale of a photoelectric encoder according to claim 11, wherein:
the base member is made of a light absorptive or transmissive material;
the method further comprises:
forming a transparent conductive film on the surface of the base member; and
the metal gratings are made of a light reflection film.

15. The method of manufacturing a scale of a photoelectric encoder according to claim 11, further comprising:
blackening of the surface of the base member,
wherein the metal gratings are made of a light reflection film.

16. The method of manufacturing a scale of a photoelectric encoder according to claim 11, further comprising:
forming a conductive light reflection film on the surface of the base member,
wherein the metal gratings are made of a blackened metal film.

17. The scale of a photoelectric encoder according to claim 1, wherein:
the surface of the base member is the roughened surface which is roughened by sandblasting.

18. The scale of a photoelectric encoder according to claim 1, wherein:
the surface of the base member is the roughened surface which is roughened with a chemical.

19. The method of manufacturing a scale of a photoelectric encoder according to claim 6, wherein:
the roughening the surface of the base member comprises sandblasting the surface of the base member.

20. The method of manufacturing a scale of a photoelectric encoder according to claim 6, wherein:

the roughening the surface of the base member comprises treating the surface of the base member with a chemical.

* * * * *